(12) United States Patent
Yamada

(10) Patent No.: US 7,920,428 B2
(45) Date of Patent: *Apr. 5, 2011

(54) METHODS AND APPARATUSES RELATING TO AUTOMATIC CELL THRESHOLD VOLTAGE MEASUREMENT

(75) Inventor: Shigekazu Yamada, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/352,147

(22) Filed: Jan. 12, 2009

(65) Prior Publication Data

US 2009/0116290 A1    May 7, 2009

Related U.S. Application Data

(63) Continuation of application No. 11/511,172, filed on Aug. 28, 2006, now Pat. No. 7,483,305.

(30) Foreign Application Priority Data

Aug. 25, 2006 (JP) .................................. 2006228873

(51) Int. Cl.
*G11C 16/06* (2006.01)
(52) U.S. Cl. ........... 365/185.2; 365/185.25; 365/185.05; 365/185.17; 365/185.18; 365/185.21
(58) Field of Classification Search ............... 365/185.2, 365/185.25, 185.05, 185.17, 185.18, 185.21
See application file for complete search history.

(56) References Cited

U.S. PATENT DOCUMENTS

| | | | |
|---|---|---|---|
| 5,587,948 A | 12/1996 | Nakai |
| 5,600,594 A | 2/1997 | Padoan et al. |
| 5,615,154 A | 3/1997 | Yamada |
| 5,956,277 A | 9/1999 | Roohparvar |
| 5,966,330 A | 10/1999 | Tang et al. |
| 6,205,057 B1 | 3/2001 | Pan |
| 6,226,200 B1 | 5/2001 | Eguchi et al. |
| 6,285,598 B1 | 9/2001 | Khan et al. |
| 6,324,094 B1 | 11/2001 | Chevallier |
| 6,496,415 B2 | 12/2002 | Tsao |
| 6,542,409 B2 | 4/2003 | Yamada |

(Continued)

OTHER PUBLICATIONS

International Search Report dated Apr. 4, 2008, for International Application No. PCT/US2007/076246 (5 pages).

*Primary Examiner* — Hoai V Ho
*Assistant Examiner* — Kretella Graham
(74) *Attorney, Agent, or Firm* — TraskBritt

(57) ABSTRACT

Methods and apparatuses for automatically measuring memory cell threshold voltages are disclosed. Measurement circuitry includes an internal reference current generator, a plurality of memory cells and a bit line pre-charge reference circuit. If the reference current is greater than the memory cell current, the bit line voltage will increase. Conversely, if the reference current is less than the memory cell current, the bit line voltage will decrease. The reference current is generated in large steps until a comparator, that compares the bit line voltage and a bit line pre-charge reference voltage, is switched. The reference current then generates a current in small steps until the comparator is again switched. The reference current converges on the memory cell current within an accuracy of 10 nA. The memory cell threshold voltage is then determined from the memory cell current. Systems including memory according to an embodiment of the invention are also disclosed.

20 Claims, 10 Drawing Sheets

U.S. PATENT DOCUMENTS

| | | |
|---|---|---|
| 6,580,644 B1 | 6/2003 | Chung |
| 6,714,453 B2 | 3/2004 | Cavaleri et al. |
| 6,781,884 B2 | 8/2004 | Yamada |
| 6,819,612 B1 | 11/2004 | Achter |
| 6,839,279 B2 | 1/2005 | Yamada |
| 6,912,160 B2 | 6/2005 | Yamada |
| 6,975,542 B2 | 12/2005 | Roohparvar |
| 7,031,210 B2 | 4/2006 | Park et al. |
| 7,038,482 B1 | 5/2006 | Bi |
| 7,483,305 B2 * | 1/2009 | Yamada ............... 365/185.2 |
| 2002/0118574 A1 | 8/2002 | Gongwer et al. |
| 2005/0105333 A1 | 5/2005 | Park et al. |

\* cited by examiner

METHODS AND APPARATUSES RELATING TO AUTOMATIC CELL THRESHOLD VOLTAGE MEASUREMENT

CROSS-REFERENCE TO RELATED APPLICATION

This application is a continuation of application Ser. No. 11/511,172, filed Aug. 28, 2006, now U.S. Pat. No. 7,483,305, issued Jan. 27, 2009.

BACKGROUND OF THE INVENTION

1. Field of the Invention

Embodiments of the invention relate generally to non-volatile memory devices and, more specifically, to methods and apparatuses for determining a threshold voltage of a non-volatile memory cell.

2. State of the Art

Non-volatile semiconductor memories are becoming increasingly popular in a wide range of electronic applications from computer systems to personal appliances such as cellular phones, personal digital assistants, cameras, and music players. With the increased popularity comes an increased need for device speed and accuracy.

Non-volatile memory cells, such as Electrically Erasable Programmable Memories (EEPROMS)/Flash EEPROMS, and Flash memories, store information in a field effect transistor (FET) using a floating gate disposed between the substrate and a control gate. FIG. 1 illustrates a Flash cell comprising a conventional transistor used in Flash memories. The Flash cell 10 includes a drain 12, a source 14, the floating gate 16, and the control gate 18. The floating gate 16 is isolated from the control gate 18 and substrate by dielectric layers formed above and below the floating gate. In Flash memories, the control gates of a plurality of Flash cells are coupled to a word line. Thus, the signal on the control gate is referred to herein as $V_{wl}$, or variations thereof.

The term "threshold voltage" refers to the voltage required on the control gate 18 to cause the device to conduct between the source 14 and drain 12 regions. The charge on the floating gate 16 is dependent upon the number of electrons contained therein. The higher the number of electrons on the floating gate 16, the higher the voltage required on the control gate 18 for the cell to conduct. In other words, when the Flash cell 10 is programmed, electrons present on the floating gate 16 increase the threshold voltage required to enable the Flash cell current 22. When electrons are absent or removed, the threshold voltage required to enable cell current 22 is decreased. If the threshold voltage of a Flash cell 10 is above a certain level, the Flash cell 10 is considered to be in a programmed state, and if the threshold voltage is below the certain level, then the flash cell 10 is considered to be in an erased state. Thus, knowing the threshold voltage of a Flash cell 10 allows a determination of the state of the Flash cell 10 (programmed or erased) to be made.

FIG. 2 illustrates operational characteristics of a Flash cell as a current versus voltage curve. In operation, an erased Flash cell exhibits current characteristics as shown by curve 20, which is defined as a binary "1." When the Flash cell is programmed, the additional charge on the floating gate moves the current curve for the Flash cell to a higher voltage. The more charge stored on the floating gate, the farther to the right the current curve will move. Curve 30 illustrates the current characteristics of a Flash cell safely programmed as a binary "0." Curve 25 illustrates the current characteristics of a Flash cell that is at a minimum acceptable programming to be considered a "0." Line 40 indicates a current threshold (Ith) at which a sense amplifier distinguishes between a programmed and an erased Flash cell. If a current from the Flash cell (Icell) is below Ith, the Flash cell will be considered erased, if Icell is above Ith, the Flash cell will be considered programmed. In other words, there is a threshold voltage (Vth), represented by line 50, at which the Flash cell conducts a high enough current for the sense amplifier to detect. Thus, after programming, a Flash cell may be read by applying a voltage that is midway between an erased voltage and a programmed voltage. With this voltage applied, if a current is sensed, the Flash cell is considered erased (i.e., "1" in this case). If a current is not sensed, the Flash cell is considered programmed (i.e., "0" in this case).

FIG. 3 is a circuit diagram of a portion of a conventional Flash memory device 100 configured as test logic for determining the cell current 116 of each cell 115 in NAND string 114. In general, FIG. 3 is used to depict a test configuration for a Flash memory device 100, rather than logic used during the normal functional operation of the Flash memory device 100. Each Flash cell 115 of NAND string 114 has a gate connected to a word line 118 from an X decoder 112. Vth PAD 122 is an input pad that may be used in a test mode configuration for driving an analog voltage at the desired Vth (i.e., threshold voltage). X decoder 112 decodes address signals (not shown) to activate the appropriate word line 118 of the selected Flash cell 114a by driving the word line 118 of the selected Flash cell 114a with the Vth signal from Vth PAD 122. Multiple sub-X decoders (one for each Flash cell) may be contained inside X decoder 112. For example, if NAND string 114 contains 32 cells, 32 sub-X decoders, for driving 32 word lines, may exist within X decoder 112. Bit line 124 is connected to the drain of NAND string 114, and the source of NAND string 114 is connected to ground potential VSS. Source select gate 134 allows the source of NAND string 114 to be selectively coupled to the ground potential VSS and drain select gate 132 allows the drain of NAND string 114 to be selectively coupled to the bit line 124. Generally, the gates of source select gate 134 and drain select gate 132 may be controlled by logic that operates during a normal functional configuration, whereas during a test mode configuration these gates may be configured with a signal that leaves the source select gate 134 and drain select gate 132 in an on configuration. Bit line 124 includes resistor 127, capacitor 129, and data_cache 125, which is a circuit used to control the read, program, and erase operations for each bit line 124. Resistor 127 and capacitor 129 are shown simply to illustrate the distributed capacitance and distributed resistance of bit line 124.

Cell current 116 flows from the drain to the source of selected Flash cell 114a and is measured during a test flow procedure. The test flow procedure requires a prolonged measurement process wherein a word line voltage is applied at a Flash cell and the current running through the cell is measured at Ith PAD 126. The word line voltage is varied and this procedure is repeated until a specific amount of current is flowing through the cell. This test flow measurement process can lead to long test times and eventually increased costs of production.

There is a need for methods and apparatuses that provides a means for determining a memory cell current internally, thus allowing the threshold voltage of the memory cell to be determined quickly and accurately in order to reduce the costs of production.

BRIEF DESCRIPTION OF THE DRAWINGS

A detailed description of various embodiments of the invention is hereafter described with specific reference being made to the drawings, in which.

DETAILED DESCRIPTION OF THE INVENTION

Figure 1:
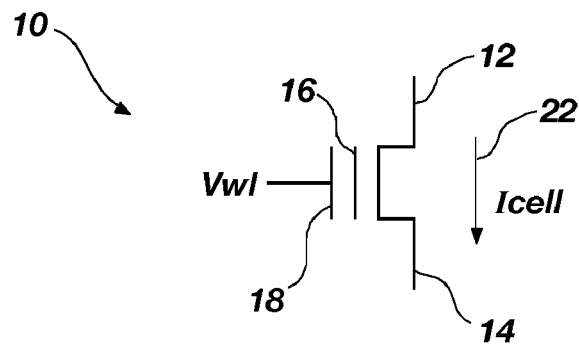
FIG. 1 is a circuit diagram of a conventional Flash memory cell.
Figure 2:
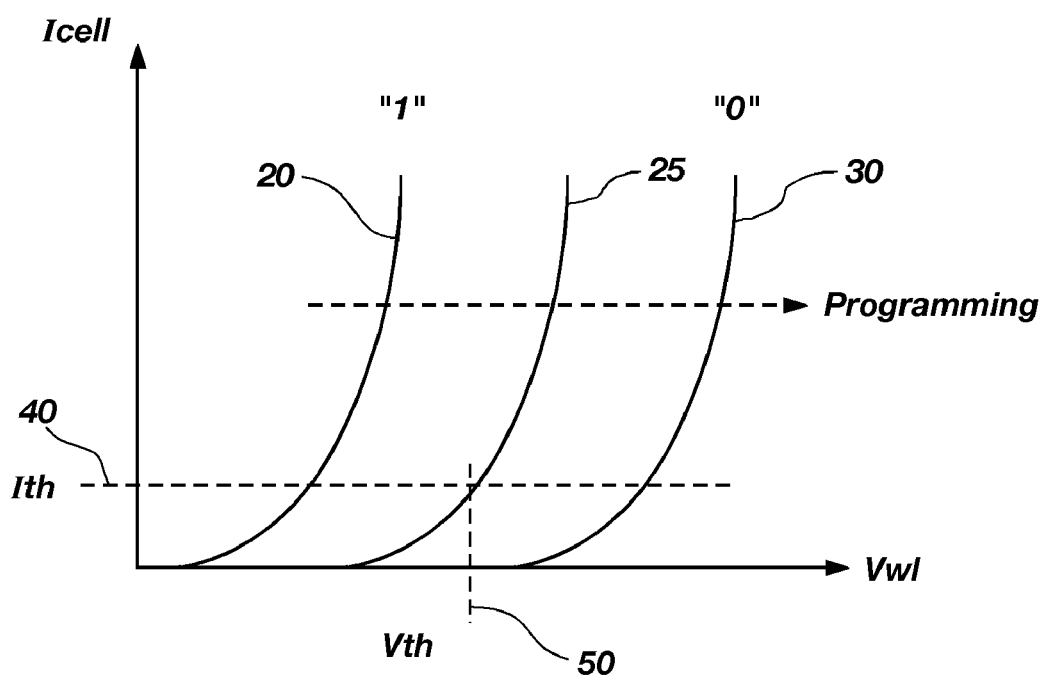
FIG. 2 is a graphical illustration of selected operational characteristics of a conventional Flash memory cell.
Figure 3:
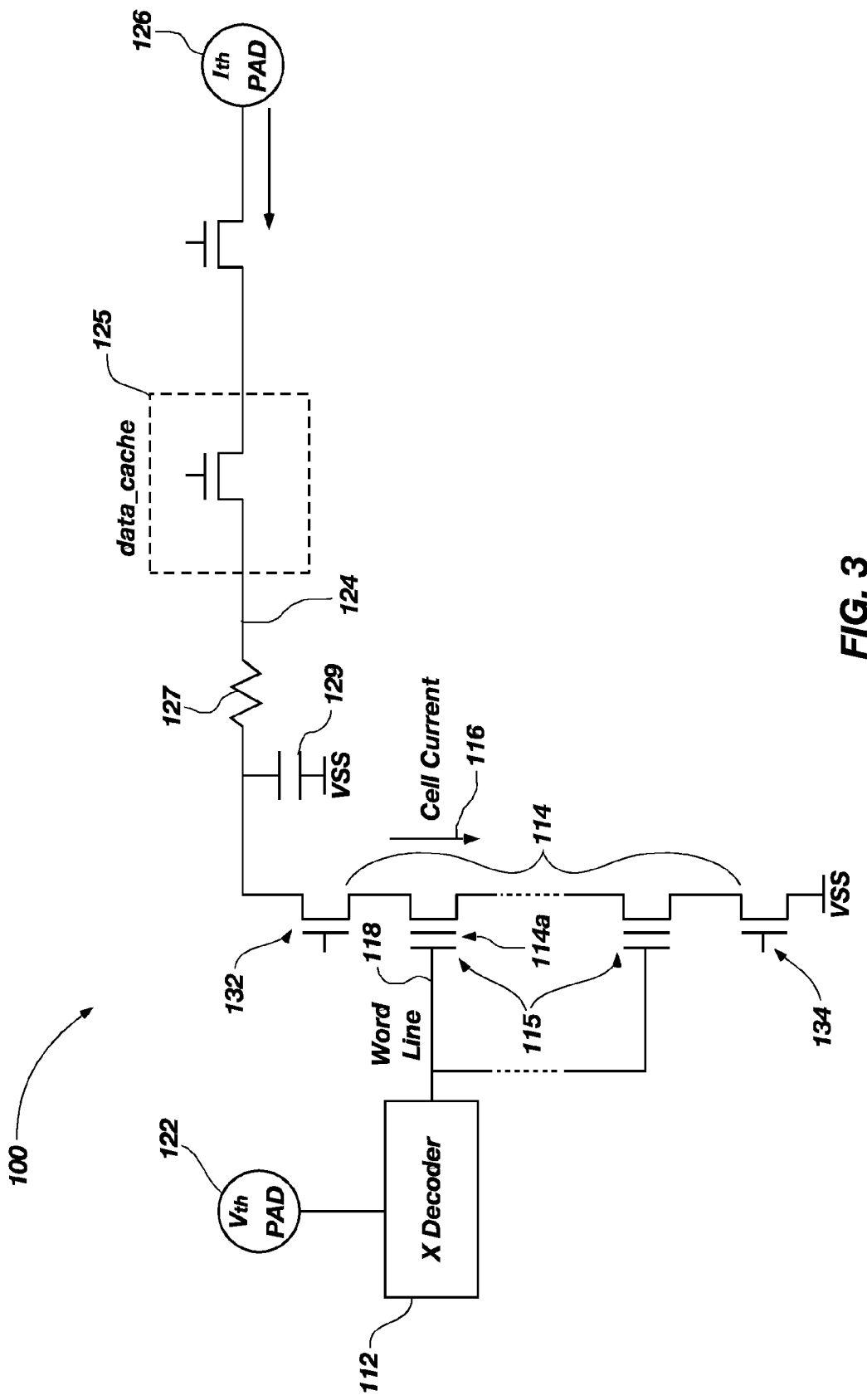
FIG. 3 is a circuit diagram of a portion of a conventional Flash memory device.

There is a need for a Flash memory device with an internal reference current generator and comparator that may reduce production costs due to increased speed and accuracy of determining memory cell current.

Embodiments of the invention provide apparatus and methods of operation for measuring the memory cell current internally and allowing automatic measurement of the threshold voltages of Flash memory cells.

In one embodiment of the invention, a threshold voltage measurement circuit comprises a reference current generator configured to internally generate a reference current. The reference current generator is operably coupled between a bit line and a first input/output device. The measurement circuit also comprises a NAND string that includes a plurality of Flash cells operably coupled together in a series configuration. A first end of the series configuration is operably coupled to the bit line and a second end of the series configuration is operably coupled to a ground voltage. Also included in the measurement circuit is a comparator configured to compare a bit line voltage and a bit line reference voltage and output a logic signal, wherein a first input of the comparator is operably coupled to the bit line. Additionally, the measurement circuit comprises a bit line pre-charge circuit configured to store the bit line reference voltage. The bit line pre-charge circuit is operably coupled to the bit line and the second input of the comparator.

Another embodiment of the invention comprises a method of measuring a threshold voltage of a memory cell comprising storing a bit line reference voltage, and selecting a Flash cell for threshold voltage measurement. The method also includes generating a reference current for operable coupling to the selected Flash cell, wherein a combination of the reference current and the Flash cell generate a bit line voltage. The method further includes comparing the bit line reference to the bit line voltage and generating a logic signal indicative of the comparison.

Another embodiment of the invention comprises a Flash memory including a threshold voltage measurement circuit. The threshold voltage measurement circuit comprises a reference current generator configured to internally generate a reference current. The reference current generator is operably coupled between a bit line and a first input/output device. The measurement circuit also comprises a NAND string that includes a plurality of Flash cells operably coupled together in a series configuration. A first end of the series configuration is operably coupled to the bit line and a second end of the series configuration is operably coupled to a ground voltage. Also included in the measurement circuit is a comparator configured to compare a bit line voltage and a bit line reference voltage and output a logic signal, wherein a first input of the comparator is operably coupled to the bit line. Additionally, the measurement circuit comprises a bit line pre-charge circuit configured to store the bit line reference voltage. The bit line pre-charge circuit is operably coupled to the bit line and the second input of the comparator.

Yet another embodiment of the present invention includes an electronic system comprising at least one input device, at least one output device, a processor, and at least one Flash memory device comprising a threshold voltage measurement circuit according to an embodiment of the present invention.

In this description, circuits and functions may be shown in block diagram form in order not to obscure various embodiments of the present invention in unnecessary detail. Conversely, specific circuit implementations shown and described are exemplary only and should not be construed as the only way to implement the various embodiments of the present invention unless specified otherwise herein. Additionally, block definitions and partitioning of logic between various blocks is exemplary of a specific implementation. It will be readily apparent to one of ordinary skill in the art that the various embodiments of the present invention may be practiced by numerous other partitioning solutions. For the most part, details concerning timing considerations and the like, have been omitted where such details are not necessary to obtain a complete understanding of the various embodiments of the present invention and are within the abilities of persons of ordinary skill in the relevant art.

The description herein relates to non-volatile memory cells, including without limitation Electrically Erasable Programmable Memory (EEPROM) cells, Flash EEPROM cells and Flash cells. It should be understood that embodiments of the present invention may be practiced with any of these non-volatile memory cells. The term "PAD" is used herein for the sake of convenience and brevity when referring to an input or output to or from a semiconductor device. The specific PADs described herein may be used exclusively for testing purposes, wherein the signal on the PAD may be driven from a tester, or in other cases may be used for both testing and as a conventional input/output signal used during normal operation.

In this description, some drawings may illustrate signals as a single signal for clarity of presentation and description. It will be understood by a person of ordinary skill in the art that the signal may represent a bus of signals, wherein the bus may have a variety of bit widths and the embodiment of the present invention may be implemented on any number of data signals including a single data signal. The terms "assert" and "negate" are respectively used when referring to the rendering of a signal, status bit, or similar apparatus into its logically true or logically false state. If the logically true state is a logic level one, the logically false state will be a logic level zero. Conversely, if the logically true state is a logic level zero, the logically false state will be a logic level one.

Figure 4:
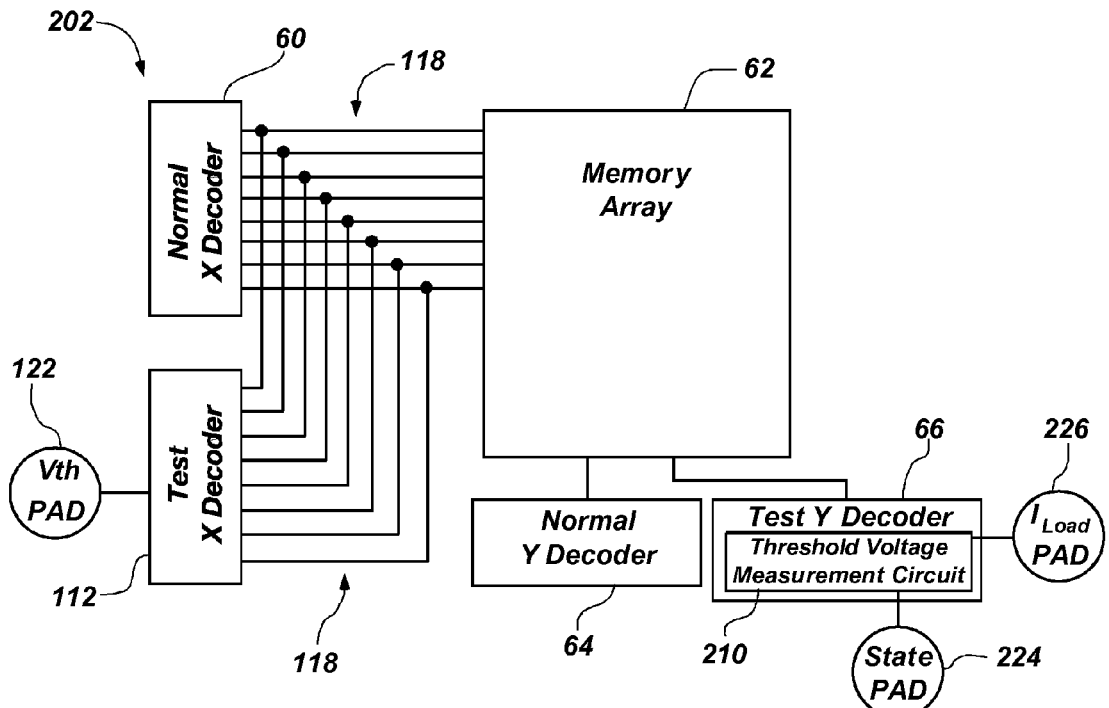
FIG. 4 is a block diagram of an embodiment of a Flash memory device including test logic according to an embodiment of the present invention.

FIG. 4 is a block diagram of an embodiment of a memory device 202 according to an embodiment of the present invention. In normal operation, normal X decoder 60 activates corresponding word lines 118 of selected memory cells in memory array 62 to be erased, written to, or read from. Normal Y decoder 64 controls the actual read, write, and/or erase operations for the selected memory cells within memory array 62. Test X decoder 112 and test Y decoder 66 do not contribute to normal operation.

In test mode operation, test X decoder 112 receives an analog voltage from Vth PAD 122 and places a corresponding analog voltage on a word line of a selected Flash cell within memory array 62 by applying a select voltage at the gate of the cell selected for testing. Test Y decoder 66 includes a threshold voltage measurement circuit 210 which receives a digital signal from $I_{LOAD}$ PAD 226 and generates a desired reference current. The reference current is sent to memory array 62, a testing procedure is implemented, and a test result is output on state PAD 224. In general, normal X decoder 60 and normal Y decoder 64 contribute minimally during the test mode operation.

Figure 5:
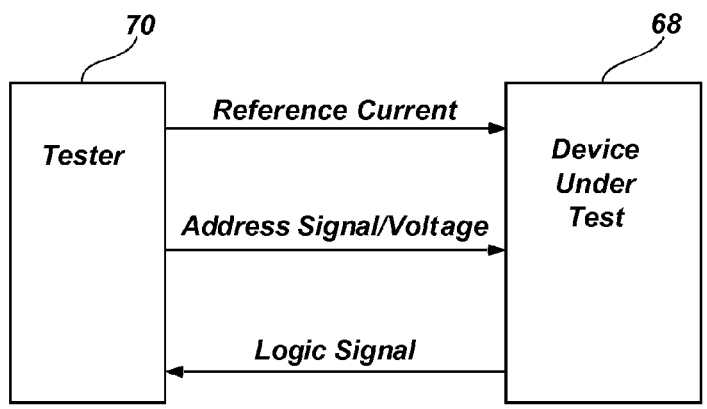
FIG. 5 is a block diagram of a testing operation in accordance with an embodiment of the invention.

FIG. 5 is a block diagram of a Flash memory testing setup including a tester 70 and a device under test 68 (i.e., the memory device 202). Tester 70 may be configured to supply the necessary signals to the memory device 202 to perform normal functional tests as well as the test modes described herein. As shown, the address signal/voltage signal may be used to supply the proper Vth voltage level to the memory device 202 during test modes. The address signal designates a target cell and the word line voltage with the proper Vth is applied at the gate of the addressed cell. The reference current sent from tester 70 to the memory device 202 will be described later herein. Upon completion of specific tests of the testing procedure, memory device 202 sends an output in the form of a logic signal back to tester 70, and tester 70 determines if further testing is needed.

Figure 6:
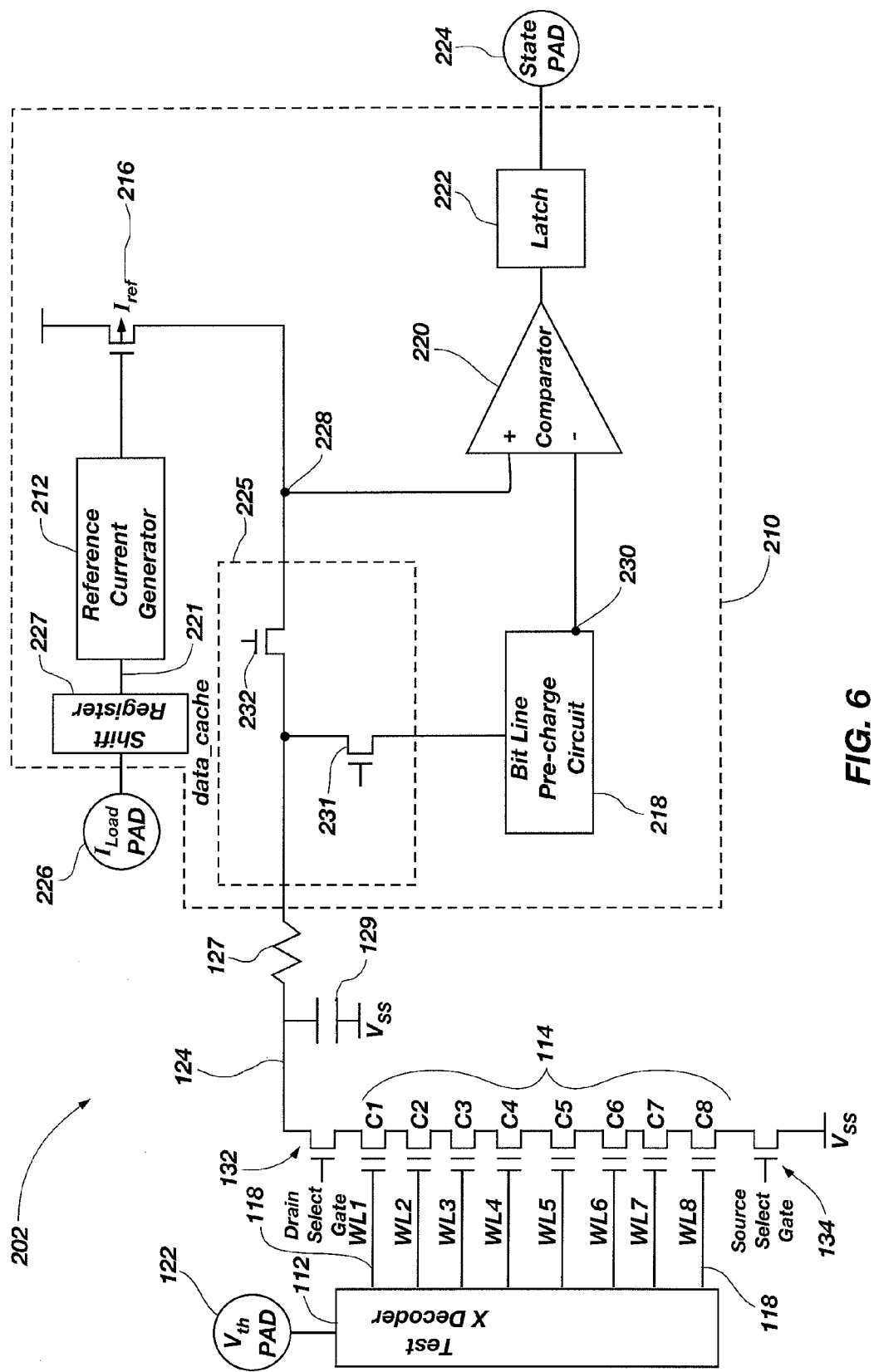
FIG. 6 is a circuit diagram of a portion of a Flash memory device including a threshold voltage measurement circuit in accordance with an embodiment of the invention.

FIG. 6 is a circuit diagram of a portion of a Flash memory device 202 including the test X decoder 112, NAND string 114 and threshold voltage measurement circuit 210. For simplicity, generally only test logic portions of memory device 202, along with relevant portions of memory array 62 (FIG. 4) are shown. NAND string 114 represents one column of the multiple column memory array 62 (FIG. 4). For simplicity of explanation, and not by limitation, NAND string 114 contains eight Flash cells (C1-C8). Each of the eight Flash cells (C1-C8) in NAND string 114 has a gate connected to one of the word lines 118 which, in turn, is connected to X decoder 112 and Vth PAD 122. As described above, multiple sub-X decoders (one for each Flash cell) are contained inside X decoder 112. In operation, X decoder 112 decodes a selected address, receives the appropriate threshold voltage from Vth PAD 122, and activates a word line of a selected Flash cell by applying a select voltage substantially near the same voltage level as the voltage at Vth PAD 122 to the gate of the selected cell. In addition, the remaining unselected cells are placed in a bypass state by applying a bypass voltage at the gates of the unselected cells, which leaves the unselected cells in a conducting state. Bit line 124 is connected to the drain of NAND string 114, and the source of NAND string 114 is connected to ground potential VSS. Source select gate 134 allows the source of NAND string 114 to be selectively coupled to the ground potential VSS and drain select gate 132 allows the drain of the NAND string 114 to be selectively coupled to the bit line 124. As stated earlier, the gates of source select gate 134 and drain select gate 132 may be controlled by logic that operates during a normal functional configuration, whereas during a test mode configuration these gates may be configured with a signal that leaves the source select gate 134 and drain select gate 132 in an on configuration. Bit line 124 also includes resistor 127 and capacitor 129. Data cache 225 is a circuit that may include transistors 231, 232 with gates controlled by logic that are used to control the read, program, and erase operations for each bit line 124. Resistor 127 and capacitor 129 are shown simply to illustrate the distributed capacitance and distributed resistance of bit line 124.

Threshold voltage measurement circuit 210 includes shift register 227, $I_{LOAD}$ PAD 226 and reference current generator 212, which may be configured to generate a constant reference current 216 in a selected range, for example between 10 and 2560 nA. Additionally, measurement circuit 210 includes a bit line pre-charge circuit 218, which stores a bit line reference voltage 230. Bit line reference voltage 230 and bit line voltage 228 are inputs to comparator 220 and, depending on the input voltages, comparator 220 outputs a high or low value to latch 222. Latch 222 stores the data from comparator 220 and outputs the stored value to state PAD 224.

Figure 7:
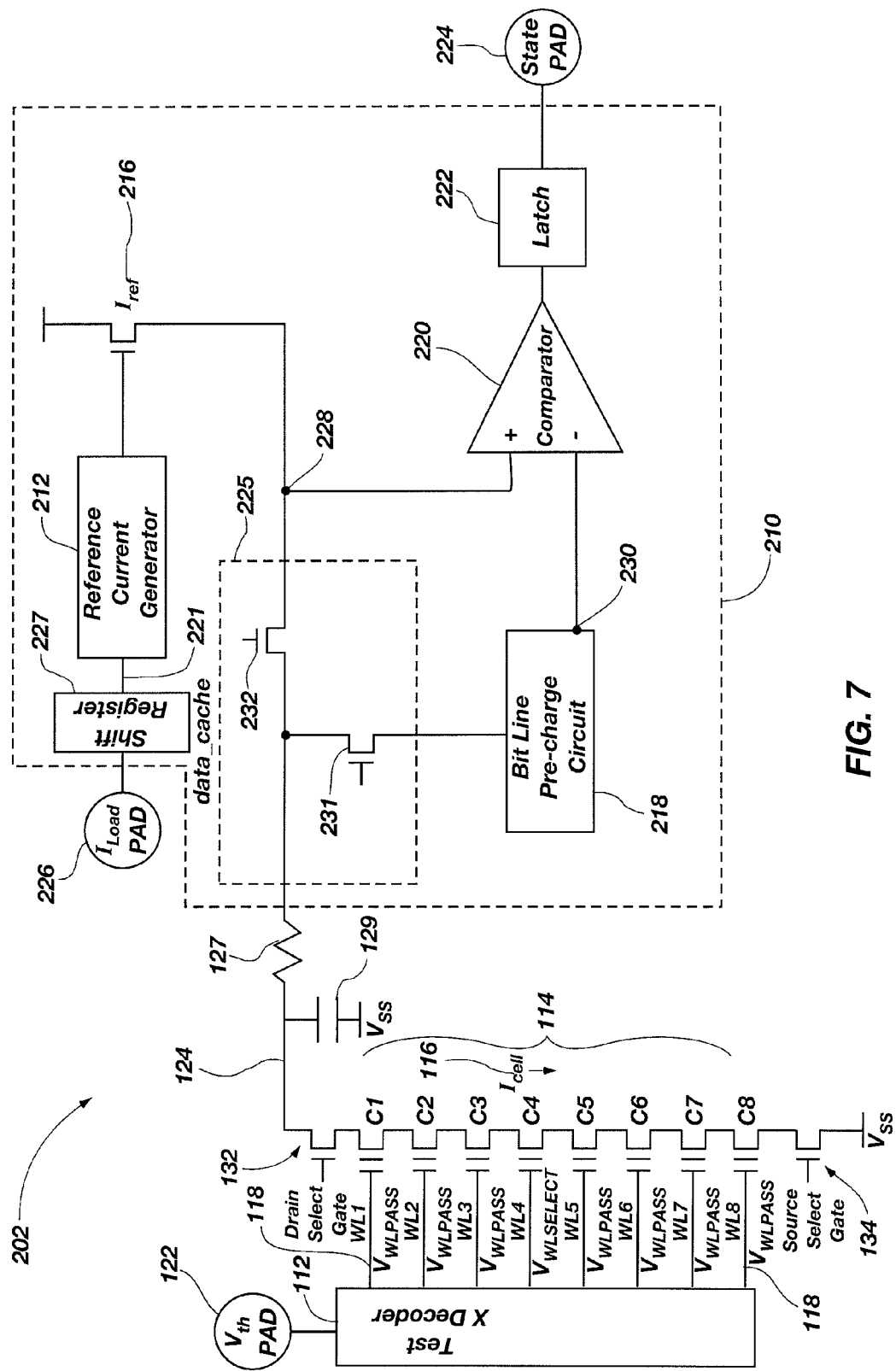
FIG. 7 is a circuit diagram of a portion of a Flash memory device including a threshold voltage measurement circuit in accordance with an embodiment of the invention.

The operation of the circuit of FIG. 6 will now be discussed with reference to FIG. 7. FIG. 7 is a circuit diagram of a portion of a Flash memory device 202 similar to FIG. 6 except it shows a selected target cell C4. Initially, a desired reference current is input into $I_{LOAD}$ PAD 226, as a sequence of bits shifted into shift register 227. Of course, those of ordinary skill in the art will recognize that a shift register is one possible embodiment for getting a digital value into the chip. While a shift register may be useful because it only requires one pin during the test mode, within the scope of the invention, the digital value may also be loaded into the Flash memory device 202 using other methods.

With a digital value representing the desired reference current loaded, bit line 124 is pre-charged to a voltage level. The resultant voltage level pre-charged onto the bit line 124 is stored within the bit line pre-charge circuit 218 and presented as the bit line reference voltage 230. After pre-charge, reference current generator 212 generates reference current 216, as a function of the value on signal 221 from the shift register 227. In addition, Flash cell C4 is selected by test X decoder 112 by applying a word line select voltage at the gate of selected cell C4. Those cells that remain unselected in the cell string 114 are driven by a word line pass voltage (high voltage) causing them to conduct, thus allowing cell current 116 to flow from the drain to the source of target cell C4. During testing, if the cell current 116 is greater than the reference current 216, then the bit line voltage 228 will decrease. Conversely, if the cell current 116 is less than the reference current 216, then the bit line voltage 228 will increase. This potential change in the bit line voltage 228 may then be compared to the bit line reference voltage 230 and the comparison result stored in latch 222.

The test process proceeds in test steps in an attempt to determine the threshold current of the selected Flash cell based on the voltage applied to its gate. This process starts at an initial current value to apply as reference current 216. Based on the results of this initial current value (as explained below), the next test step generates a new reference current with a large current step relative to the previous value. For example, and not limitation, the large current step may be 100 nA such that the new reference current may be 100 nA lower than the reference current in the previous test step. This large current step process continues until the value on state PAD 224 changes state from one test step to the next test step. When this change occurs, the test process begins applying small current steps in the opposite direction from the large current steps. In other words, if the large current steps were decreasing the reference current on each subsequent large current step, the small current steps would increase the reference current by a small amount (for example, and not limitation, 10 nA) on each subsequent small current step. These small current steps continue until once again the value on state PAD 224 changes state from one test step to the next test step. At this point, the reference current applied during the final test step is substantially near the threshold current of the selected cell (i.e., within +/−10 nA if the small current step is 10 nA).

As a starting point for measurement, the initial reference current 216 generated may be equal to a previously measured memory cell current. For example, if a cell current measurement is desired for the fourth cell C4 in NAND string 114, then the initial reference current 216 generated may be set equal to the measured cell current for the third cell C3 in NAND string 114. If the first cell C1 in NAND string 114 is being measured, then the reference current 216 generated may be randomly set, or may be based on measured values from another column. If set randomly, measurement of the first cell C1 may take longer than other cell measurements.

After the initial current generation, and once a steady state has been reached on the bit line 124, bit line reference voltage 230 is compared to the bit line voltage 228. Latch 222 stores the logic signal output of comparator 220 and then forwards the result to state PAD 224. A tester may monitor the output of state PAD 224 and, as a result, decide the next value to be used for the reference current 216.

For example, if the output of comparator 220 is high then bit line voltage 228 is higher than the bit line reference voltage 230, and the next reference current generated should be smaller than the present reference current. This process of generating and comparing continues until the comparator 220 output switches from high to low or from low to high (i.e., the latched comparator result is in a different state for this test step than for the previous test step). When the comparator 220 output switches, cell current 116 is between the former reference current 216 and the present reference current 216. After an initial comparator 220 switch, the tester signals the reference current generator 212 to generate a small current step in a direction opposite to the large current step. After the small current step, the comparator 220 compares bit line voltage 228 and bit line reference voltage 230. Reference current 216 will be generated in small increments, and the bit line voltage 228 and bit line reference voltage 230 will be compared until the comparator output switches again. For example only, the small current step may be in 10 nA increments. When the comparator output switches, the reference current 216 is within 10 nA of the cell current 116. At this point, cell current 116 can then be determined with a high degree of accuracy (i.e., within +/−10 nA) and the threshold voltage of Flash cell in NAND string 114 may be determined.

Figure 8:
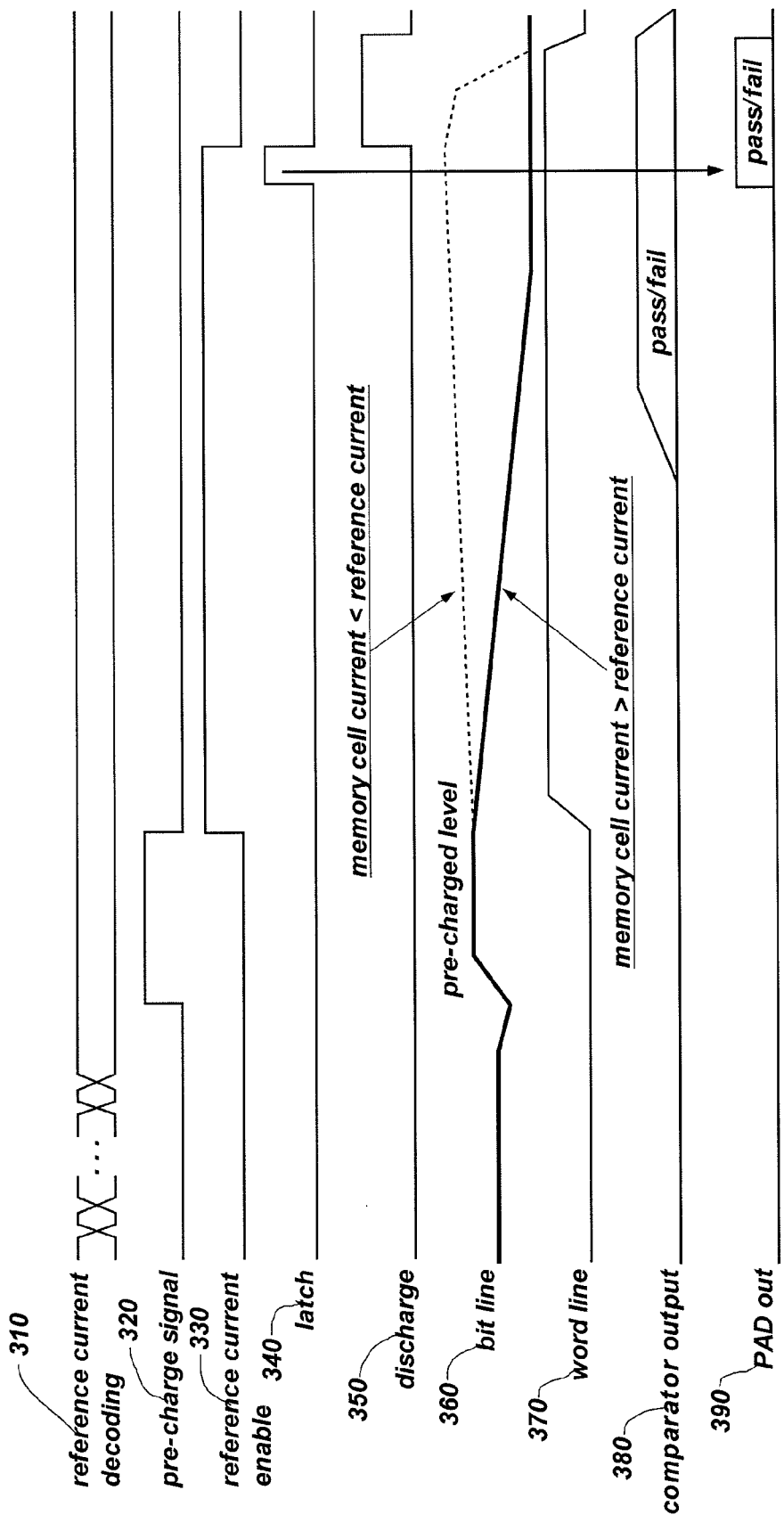
FIG. 8 is a timing diagram illustrating a circuit sequence in accordance with operation of a threshold voltage measurement circuit in accordance with an embodiment of the present invention.

FIG. 8 is a timing diagram including the various signals and operations of Flash memory device 202 including threshold voltage measurement circuit 210 (FIG. 7). Initially, a desired reference current is input into $I_{LOAD}$ PAD 226, captured by the shift register, and a reference current is decoded 310. Then, the bit line pre-charge signal 320 is asserted, causing a bit line voltage 360 to rise to the pre-charged voltage level. The resultant pre-charged voltage level is stored within the bit line pre-charge circuit and driven to the comparator as the bit line reference voltage. After the pre-charge signal 320 is negated, reference current 330 and word line voltage 370 (for the target cell) are both enabled. When the reference current 330 and the word line 370 are enabled, bit line voltage 360 either rises or falls depending on the relationship of the cell current and reference current, as described above and as a result, the output of the comparator will go high or low. Latch 340 is then asserted to latch the result of comparator output 380 into latch 222 (FIG. 7), and the result is presented as PAD out 390. Subsequently, reference current 330 and latch 340 are negated and discharge signal 350 is asserted thus resetting the bit line to zero. The word line voltage 370 and the discharge signal 350 are then negated. This process completes one test step, which is repeated until the reference current converges on the cell current within 10 nA as explained above.

Figure 9:
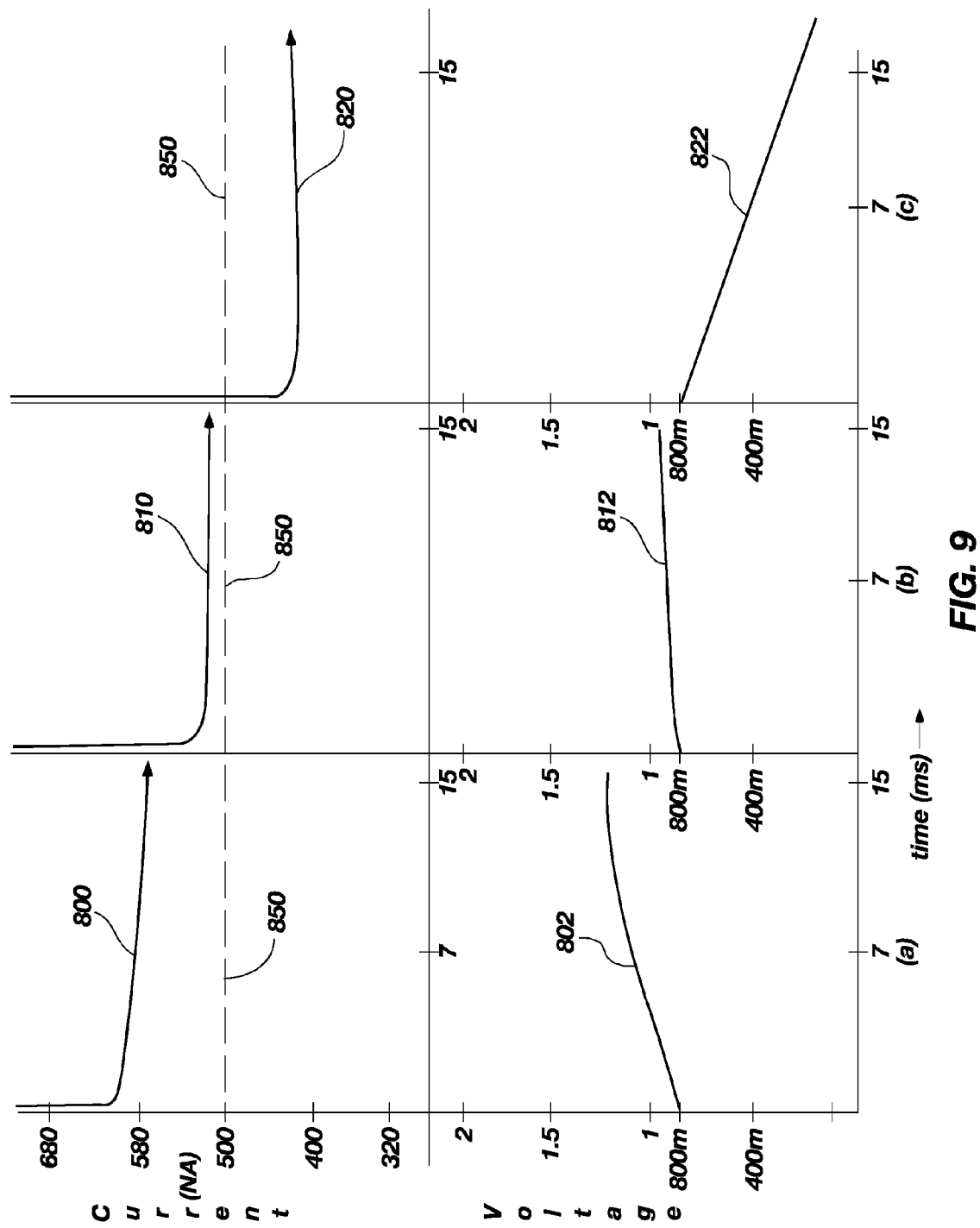
FIG. 9 depicts a timing diagram illustrating bit line voltage in relation to memory cell current and reference current with 100 nA steps.

FIG. 9 depicts a timing diagram illustrating the bit line voltage in relation to the memory cell current and the reference current. In columns (a), (b), and (c), memory cell current 850 is approximately 500 nA and the reference current is stepped in increments of 100 nA. In column (a), reference current 800 is initially generated at a current level just above 600 nA. With the reference current 800 at a value greater than the cell current 850, the bit line voltage 802 rises. The reference current generator 212 (FIG. 7) then generates the next reference current as shown in column (b). Reference current 810 is generated at a current just above 500 nA and is still slightly greater than the cell current 850. Because reference current 810 is still greater than cell current 850, bit line voltage 812 increases slightly. The reference current generator 212 (FIG. 7) then generates the next reference current as shown in column (c). Reference current 820 is generated at a value just above 400 nA and is now less than cell current 850. With reference current 820 at a current level below cell current 850, bit line voltage 822 decreases. Additionally, because reference current 820 is within 100 nA of cell current 850, the comparator output (FIG. 7) will switch from high to low or from low to high (i.e., comparator result is in a different state than the previous measurement).

Figure 10:
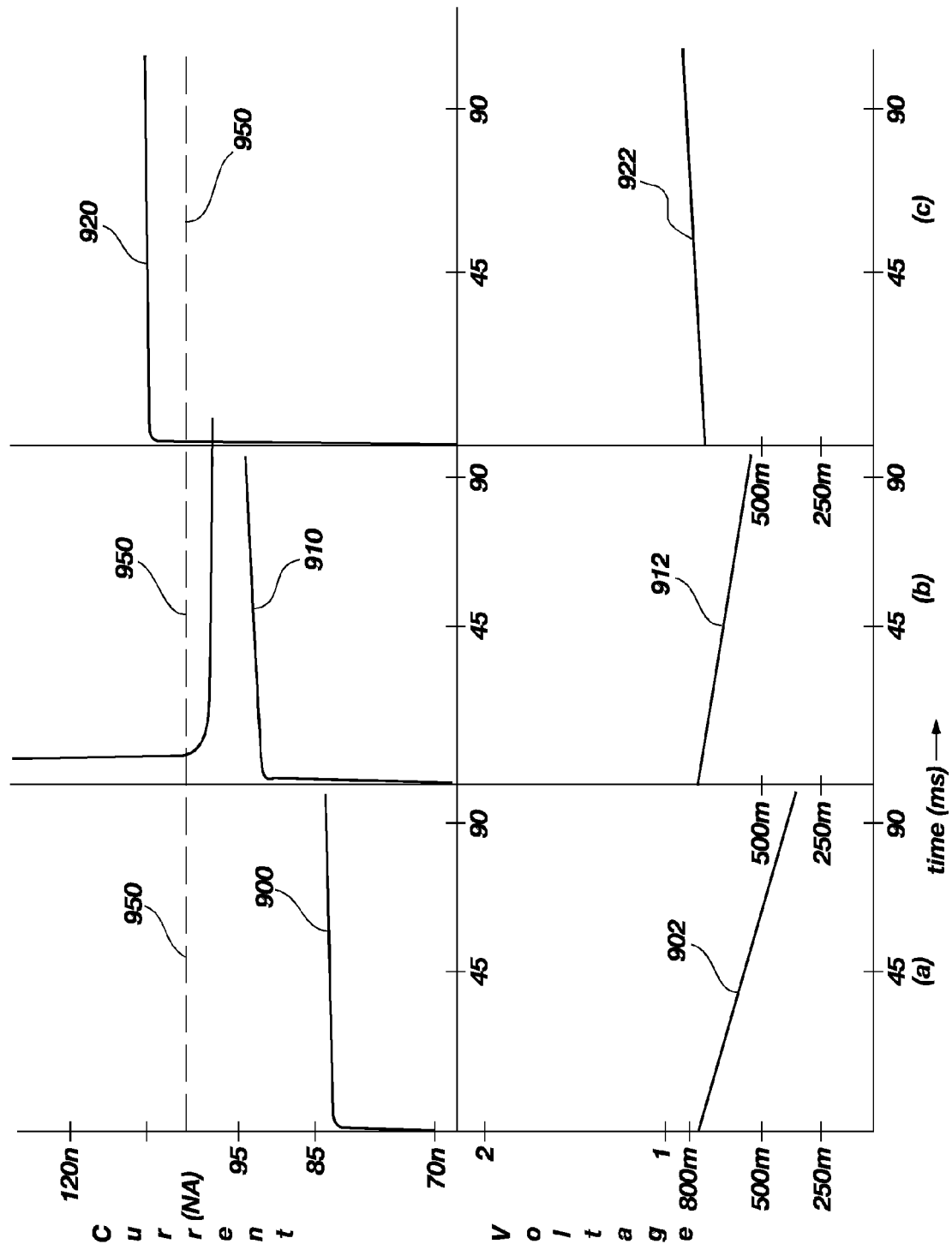
FIG. 10 depicts a timing diagram illustrating bit line voltage in relation to memory cell current and reference current with 10 nA steps.

FIG. 10 depicts a timing diagram illustrating the bit line voltage in relation to the memory cell current and the reference current. In columns (a), (b), and (c), memory cell current 950 is approximately 100 nA and the reference current is stepped in increments of 10 nA. In column (a), reference current 900 is initially generated at a current level just below 85 nA. With the reference current 900 at a value less than the cell current 950, the bit line voltage 902 decreases. The reference current generator 212 (FIG. 7) then generates the next reference current as shown in column (b). Reference current 910 is generated at a current just below 95 nA and remains less than the cell current 950. Because reference current 910 is less than cell current 950, bit line voltage 912 decreases, but not as quickly as bit line voltage 902 (shown in column (a)). The reference current generator 212 (FIG. 7) then generates the next reference current as shown in column (c). Reference current 920 is generated at a value just below 105 nA and is now greater than cell current 950. With reference current 920 at a current level above cell current 950, bit line voltage 922 increases. Additionally, because reference current 920 is within 10 nA of cell current 950, the comparator output (FIG. 7) will switch from high to low or from low to high.

Figure 11:
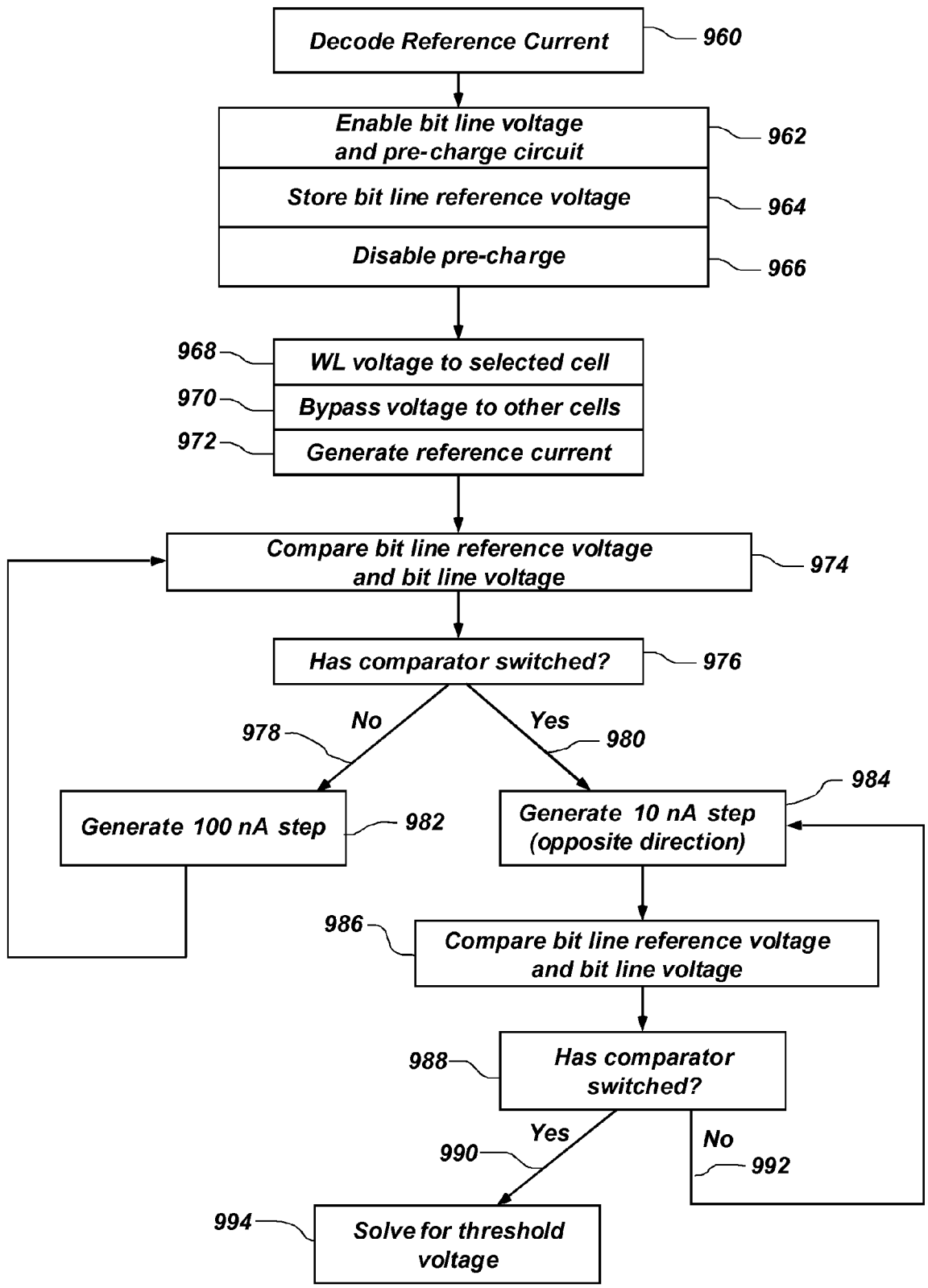
FIG. 11 is a flow diagram of an embodiment of a Flash memory device including automatic threshold voltage measurement circuitry according to an embodiment of the present invention.

FIG. 11 is a flow diagram of a testing operation performed by the combination of the tester 70 (FIG. 5), the memory device 202, and threshold voltage measurement circuit 210 (FIG. 6). Initially, a desired reference current is input into $I_{LOAD}$ PAD 226 (FIG. 6), captured by the shift register, and a reference current is decoded 960. The bit line voltage and pre-charge circuit are enabled 962 and the bit line reference voltage is stored therein 964. Subsequently, the pre-charge circuit is disabled 966. Test X decoder 112 (FIG. 6) selects a target cell 968, based on the tester input, and a corresponding word line is enabled. Simultaneously, a bypass voltage is applied to the unselected cells 970. The reference current is then generated 972 and the bit line reference voltage and the bit line voltage are compared 974 by comparator 220 (FIG. 6). A tester 70 (FIG. 5) may then determine whether the output of the comparator has switched 976 (i.e., the comparator result is in a different state for this test step than the previous test step). If the comparator 220 does not switch 978 from low to high or from high to low, the reference generator generates another reference current 982 stepped by 100 nA, and the bit line reference voltage and the bit line voltage are again compared 974 by comparator 220. If the tester 70 determines that the comparator output has switched 980, then the reference generator generates a reference current 984 with a 10 nA step in the opposite direction of the 100 nA step. Subsequently, the bit line reference voltage and the bit line voltage are compared 986 by comparator 220 and the tester 70 determines if the comparator has switched 988. If the comparator does not switch 992, then the reference current generator generates another current 984 stepped by 10 nA. If the tester 70 determines that the comparator has switched 990, then the cell current and the reference current are within 10 nA and the cell current can be accurately determined, thus allowing for the cell threshold voltage value to be solved 994 for by the tester 70.

Figure 12:
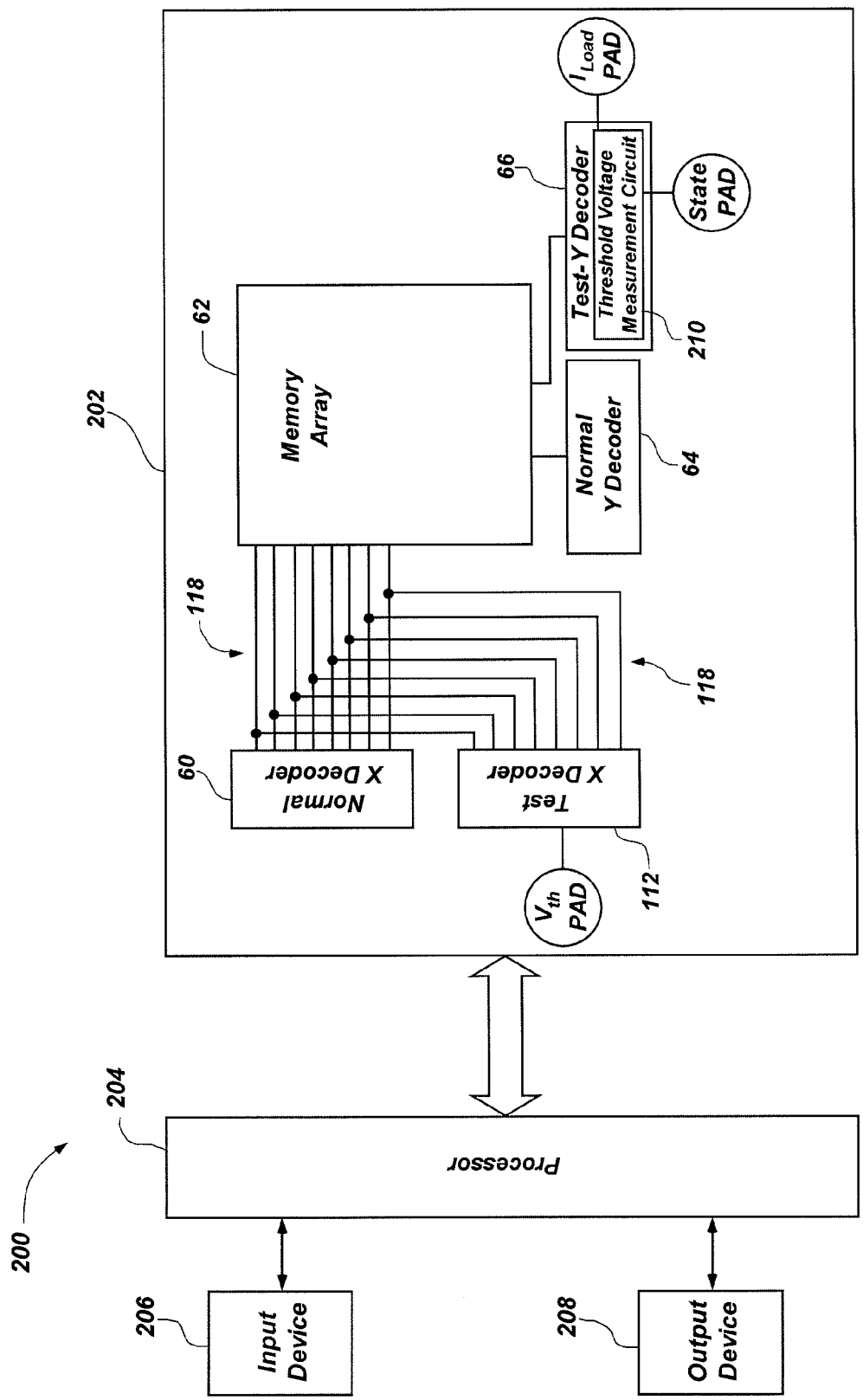
FIG. 12 is a block diagram of a system including memory according to one or more embodiments of the present invention.

As shown in FIG. 12, an electronic system 200, in accordance with an embodiment of the present invention, comprises at least one Flash memory device 202 according to an embodiment of the invention and processor 204, and may further comprise input device 206, and output device 208. Electronic system 200 may comprise, for example, a personal computer, a server, a cell phone, a personal digital assistant (PDA), a digital camera, or any other system where non-volatile memory may, desirably, be employed. Flash memory device 202 includes memory array 62, normal X decoder 60, test X decoder 112, normal Y decoder 64 and test Y decoder 66, which includes threshold voltage measurement circuit 210. Flash memory device 202 can be operated in both normal operation and in a testing procedure, wherein a threshold voltage is solved for memory cells within memory array 62.

Although this invention has been described with reference to particular embodiments, the invention is not limited to these described embodiments. Rather, the invention is limited only by the appended claims, which include within their scope all equivalent apparatus and methods that operate according to the principles of the invention as described in the various embodiments herein.

What is claimed is:

1. A threshold voltage measurement circuit, comprising:
    a reference current generator operably coupled to a bit line and configured to generate a reference current;
    a NAND string including a plurality of non-volatile memory cells operably coupled together in a series configuration, a first end of the series configuration operably coupled to the bit line;
    a bit line pre-charge circuit operably coupled to the bit line and configured to store a reference voltage charged on the bit line; and
    a comparator configured to compare a voltage on the bit line and the reference voltage;
    wherein the voltage on the bit line is at least partially dependent on both a cell current through the NAND string and the reference current.

2. The threshold voltage measurement circuit of claim 1, further comprising a threshold voltage PAD (Vth PAD) configured to supply a threshold voltage to an X decoder operably coupled to a gate of each of the plurality of non-volatile memory cells.

3. The threshold voltage measurement circuit of claim 1, wherein a drain of the NAND string is operably coupled to the bit line.

4. The threshold voltage measurement circuit of claim 3, wherein a source of the NAND string is operably coupled to a ground voltage.

5. The threshold voltage measurement circuit of claim 1, wherein the comparator is configured to output a logic signal to a latch.

6. The threshold voltage measurement circuit of claim 1, further comprising an X decoder configured to apply a select voltage at a gate of a selected non-volatile memory cell of the plurality of non-volatile memory cells.

7. The threshold voltage measurement circuit of claim 6, wherein the X decoder is further configured to apply a pass voltage at a gate of each unselected non-volatile memory cell of the plurality of non-volatile memory cells.

8. The threshold voltage measurement circuit of claim 1, wherein the bit line includes circuitry configured to control read, program, and erase operations of the bit line.

9. The threshold voltage measurement circuit of claim 1, wherein an input of the reference current generator is operably coupled to a shift register.

10. A method of measuring a threshold voltage of a non-volatile memory cell, comprising:
    storing a reference voltage charged on a bit line;
    selecting a non-volatile memory cell for threshold voltage measurement to generate a cell current therethrough;
    generating a reference current for operably coupling to the selected non-volatile memory cell, wherein a combination of the reference current and the cell current generates a bit line voltage;
    comparing the reference voltage to the bit line voltage and generating a logic signal indicative of the comparison;
    stepping the reference current in increments in a first direction until the logic signal switches, wherein stepping the reference current in increments in the first direction comprises generating the reference current with a present reference current value that differs in the first direction from a previously generated reference current value of the reference current; and
    stepping the reference current in increments in an opposite direction of the first direction and being less in value than the increments of the first direction until the logic signal switches, wherein stepping the reference current in increments in the opposite direction comprises generating the reference current with a later present reference current value that differs in the opposite direction from a previously generated reference current value of the reference current.

11. The method of claim 10, further comprising inputting a desired reference current into an input/output (I/O) device operably coupled to a reference current generator prior to generating the reference current.

12. The method of claim 11, wherein inputting the desired reference current into an input/output (I/O) device comprises inputting a sequence of bits into a shift register operably coupled to the input/output (I/O) device.

13. The method of claim 10, further comprising storing the logic signal at a latch after comparing the reference voltage to the bit line voltage.

14. The method of claim 10, further comprising outputting the logic signal to an input/output (I/O) device.

15. The method of claim 14, further comprising monitoring an output of the input/output (I/O) device and determining a subsequent reference current value to be generated.

16. The method of claim 10, further comprising inputting a threshold voltage to a threshold voltage PAD (Vth PAD) prior to selecting a non-volatile memory cell for threshold voltage measurement.

17. The method of claim 10, wherein generating the reference current comprises randomly generating a starting reference current value for the reference current.

18. A threshold voltage measurement circuit, comprising:
- a reference current generator operably coupled to a bit line and configured to internally generate a reference current, wherein an input of the reference current generator is operably coupled to a first input/output (I/O) device;
- a NAND string including a plurality of non-volatile memory cells operably coupled together in a series configuration, a first end of the series configuration operably coupled to the bit line and a second end of the series configuration operably coupled to a ground voltage;
- a comparator configured to compare a bit line voltage and a bit line reference voltage and generate a logic signal, wherein a first input of the comparator is operably coupled to the bit line; and
- a bit line pre-charge circuit operably coupled to the bit line and a second input of the comparator and configured to store the bit line reference voltage;
- wherein the voltage on the bit line is at least partially dependent on both a cell current through the NAND string and the reference current.

19. The threshold voltage measurement circuit of claim 18, wherein the NAND string comprises one of a plurality of Flash memory cells, a plurality of EEPROM cells, and a plurality of Flash EEPROM cells.

20. The threshold voltage measurement circuit of claim 18, further comprising a source select gate configured to enable operably coupling of a source of the NAND string and a ground potential and a drain select gate configured to enable operably coupling of a drain of the NAND string and the bit line.

* * * * *

UNITED STATES PATENT AND TRADEMARK OFFICE
CERTIFICATE OF CORRECTION

PATENT NO. : 7,920,428 B2  
APPLICATION NO. : 12/352147  
DATED : April 5, 2011  
INVENTOR(S) : Shigekazu Yamada Page 1 of 1

It is certified that error appears in the above-identified patent and that said Letters Patent is hereby corrected as shown below:

On the Title page, in "Assistant Examiner" Item [74], in column 2, line 1, delete "Kretella Graham" and insert -- Kretelia Graham --, therefor.

Signed and Sealed this
Twenty-fourth Day of May, 2011

David J. Kappos
*Director of the United States Patent and Trademark Office*